(12) United States Patent
Yang et al.

(10) Patent No.: US 7,808,023 B2
(45) Date of Patent: *Oct. 5, 2010

(54) METHOD AND APPARATUS PROVIDING INTEGRATED COLOR PIXEL WITH BURIED SUB-WAVELENGTH GRATINGS IN SOLID STATE IMAGERS

(75) Inventors: Zhaohui Yang, Crystal, MN (US); Ulrich C. Boettiger, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 238 days.

This patent is subject to a terminal disclaimer.

(21) Appl. No.: 11/209,774

(22) Filed: Aug. 24, 2005

(65) Prior Publication Data

US 2007/0045685 A1    Mar. 1, 2007

(51) Int. Cl.
*H01L 31/062* (2006.01)
(52) U.S. Cl. ............... 257/294; 257/291; 257/292; 257/E27.131; 257/E27.132; 257/E27.133
(58) Field of Classification Search ............ 257/91, 257/92, 94, 291, 292, 294; 438/70
See application file for complete search history.

(56) References Cited

U.S. PATENT DOCUMENTS

| | | | | |
|---|---|---|---|---|
| 4,255,019 A | * | 3/1981 | Knop | 359/569 |
| 4,708,436 A | * | 11/1987 | Kleinknecht | 359/575 |
| 5,682,266 A | * | 10/1997 | Meyers | 359/571 |
| 5,708,264 A | | 1/1998 | Hawkins et al. | |
| 6,121,667 A | * | 9/2000 | Lee | 257/448 |
| 6,140,630 A | | 10/2000 | Rhodes | |
| 6,204,524 B1 | | 3/2001 | Rhodes | |
| 6,297,071 B1 | | 10/2001 | Wake | |
| 6,307,243 B1 | * | 10/2001 | Rhodes | 257/432 |
| 6,310,366 B1 | | 10/2001 | Rhodes et al. | |
| 6,326,652 B1 | | 12/2001 | Rhodes | |
| 6,333,205 B1 | | 12/2001 | Rhodes | |
| 6,376,868 B1 | | 4/2002 | Rhodes | |
| 6,423,980 B1 | * | 7/2002 | Wilson et al. | 257/21 |
| 6,445,453 B1 | | 9/2002 | Hill | |
| 6,473,238 B1 | | 10/2002 | Daniell | |
| 6,501,109 B1 | * | 12/2002 | Chi | 257/223 |
| 6,552,805 B2 | | 4/2003 | Hill | |
| 6,587,276 B2 | | 7/2003 | Daniell | |
| 6,606,159 B1 | | 8/2003 | Hill | |
| 6,617,189 B1 | | 9/2003 | Chen et al. | |
| 6,667,809 B2 | | 12/2003 | Hill | |
| 6,721,101 B2 | | 4/2004 | Daniell | |

(Continued)

FOREIGN PATENT DOCUMENTS

WO    WO 03/044831    *    5/2003

OTHER PUBLICATIONS

"MEMS Meets Nano-optics", by Hubert Kostal and Jim Wong, Nov. 2005, Fiber Optic Technology, pp. 8-13.

*Primary Examiner*—A. Sefer
(74) *Attorney, Agent, or Firm*—Dickstein Shapiro LLP

(57) ABSTRACT

Imaging devices utilizing sub-wavelength gratings to separate the spectral components of the natural white light are disclosed. This disclosed method and apparatus redirects the light to be collected onto separate photosensors for different wavelengths to provide improved quantum efficiency.

46 Claims, 9 Drawing Sheets

U.S. PATENT DOCUMENTS

| | | |
|---|---|---|
| 6,753,968 B2 | 6/2004 | Hill |
| 6,775,009 B2 | 8/2004 | Hill |
| 6,847,029 B2 | 1/2005 | Hill |
| 7,002,231 B2 | 2/2006 | Rhodes et al. |
| 7,038,184 B2 * | 5/2006 | Chang .................... 250/208.1 |
| 2002/0024001 A1 * | 2/2002 | Hiyama et al. ........... 250/208.1 |
| 2002/0117658 A1 * | 8/2002 | Bandara et al. ............... 257/14 |
| 2002/0162944 A1 * | 11/2002 | Huang et al. ............. 250/208.1 |
| 2003/0038949 A1 * | 2/2003 | Degertekin et al. ......... 356/498 |
| 2006/0011955 A1 * | 1/2006 | Baggenstoss ............... 257/292 |
| 2006/0198008 A1 * | 9/2006 | Li et al. ...................... 359/227 |

* cited by examiner

US 7,808,023 B2

METHOD AND APPARATUS PROVIDING INTEGRATED COLOR PIXEL WITH BURIED SUB-WAVELENGTH GRATINGS IN SOLID STATE IMAGERS

FIELD OF THE INVENTION

The present invention relates generally to imaging devices and fabrication methods for forming an imaging pixel cell with an optical path.

BACKGROUND OF THE INVENTION

Solid state imager devices which include charge-coupled-devices (CCD) and complementary metal oxide semiconductor (CMOS), have commonly been used in photo-imaging applications.

Imager devices typically contain thousands of pixels in a pixel array on a single chip. Pixels convert light into an electrical signal that can then be stored and recalled by an electrical device such as, for example, a processor. The electrical signals that are stored may be recalled to produce an image on, for example, a computer screen or a printable media.

Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, and 6,333,205, each of which is assigned to Micron Technology, Inc. The disclosures of each of the forgoing patents are hereby incorporated by reference in their entirety.

Solid state imager devices typically have an array of pixel cells containing photosensors, where each pixel cell produces a signal corresponding to the intensity of light impinging on that element when an image is focused on the array. These signals may then be used, for example, to display a corresponding image on a monitor or otherwise used to provide information about the optical image. The photosensors are typically photogates, phototransistors, photoconductors or photodiodes, where the conductivity of the photosensor corresponds to the intensity of light impinging on the photosensor. The magnitude of the signal produced by each pixel cell, therefore, is proportional to the amount of light impinging on the photosensor.

CMOS active pixel sensor (APS) solid state imaging devices are described, for example, in the foregoing patents. These imaging devices include an array of pixel cells, arranged in rows and columns, that convert light energy into electric signals. Each pixel includes a photodetector and one or more active transistors. The transistors typically provide amplification, read-out control and reset control, in addition to producing the electric signal output from the cell.

While CCD technology has a widespread use, CMOS imagers are being increasingly used as low cost imaging devices. A CMOS imager circuit includes a focal plane array of pixel cells, each one of the cells including a photoconversion device, for example, a photogate, photoconductor, phototransistor, or a photodiode for accumulating photo-generated charge in a portion of the substrate. A readout circuit is connected to each pixel cell and includes at least an output transistor, which receives photogenerated charges from a doped diffusion region and produces an output signal which is periodically read out through a pixel access transistor. The imager may optionally include a transistor for transferring charge from the photoconversion device to the diffusion region or the diffusion region may be directly connected to or be part of the photoconversion device. A transistor is also typically provided for resetting the diffusion region to a predetermined charge level before it receives the photoconverted charges.

In a CMOS imager, the active elements of a pixel cell perform the necessary functions of: (1) photon to charge conversion; (2) accumulation of image charge; (3) transfer of charge to a floating diffusion region accompanied by charge amplification; (4) resetting the floating diffusion region to a known state; (5) selection of a pixel cell for readout; and (6) output and amplification of a signal representing the pixel cell charge. Photo-charge may be amplified when it moves from the initial charge accumulation region to the floating diffusion region. The charge at the floating diffusion region is typically converted to a pixel output voltage by a source follower output transistor.

Each pixel cell receives light focused through one or more micro-lenses. Micro-lenses on a CMOS imager help increase optical efficiency and reduce cross talk between pixel cells. A reduction of the size of the pixel cells allows for a greater number of pixel cells to be arranged in a specific pixel cell array, thereby increasing the resolution of the array.

To detect color, the spectral components of incident light must be separated and collected. An absorptive color filter array (CFA) on top of an imager chip is currently the dominant technology for color detection in a solid state image sensor, for example, a CCD or CMOS imager. In a typical CFA layout, a color filter for each individual photo sensor of the imager allows only a narrow spectral band (red, green, or blue) to pass, and absorbs the rest of photo energy. This greatly reduces the overall efficiency of the image sensor. Moreover, the color mosaic required for this technique increases the fabrication cost and complexity, and can lead to quality issues such as non-planarity and streaks.

There is needed, therefore, another method for color separation in solid state imagers compatible with imager fabrication processes.

BRIEF SUMMARY OF THE INVENTION

The present invention provides an imager method and apparatus in which diffraction gratings, preferably sub-wavelength gratings, are used to separate spectral components of light incident on the imager for color separation and detection. In a representative exemplary embodiment, simple square-wave phase gratings are used for color separation.

Additional advantages and features of the present invention will be apparent from the following detailed description and drawings which illustrate preferred embodiments of the invention.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE INVENTION

Figure 1:
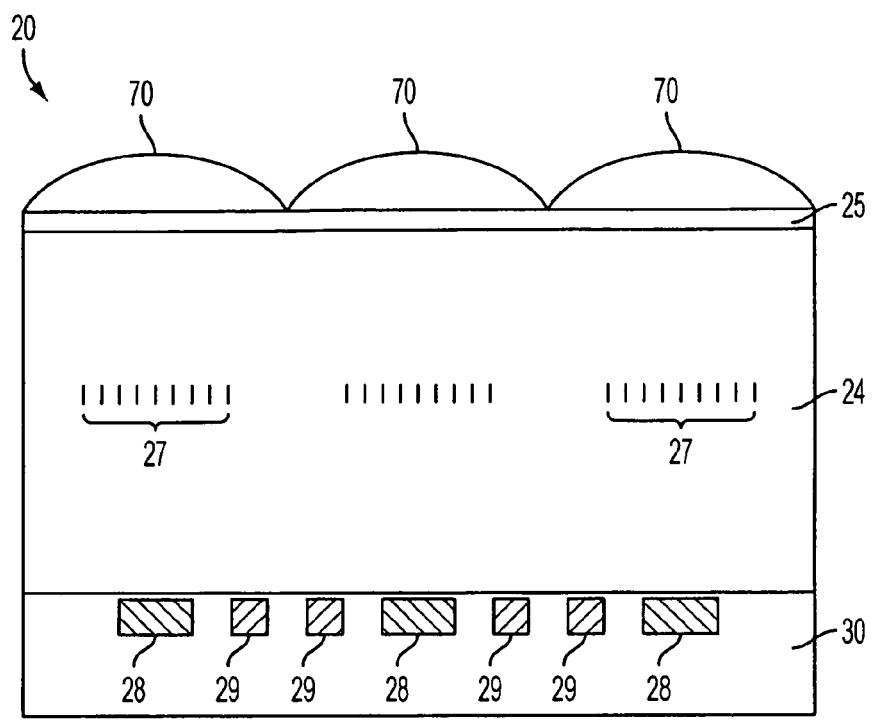
FIG. 1 illustrates a side cross-sectional view perpendicular to the grating having a diffraction grating in accordance with an exemplary embodiment of the present invention.

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "substrate" is to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductors and semiconductor structures. When reference is made to the substrate in the following description, previous process steps may have been utilized to form regions or junctions in or over the base semiconductor or foundation.

The term "pixel," as used herein, refers to a photo-element unit cell containing at least one photosensor and additional structure for converting photons to an electrical signal. For purposes of illustration, a single representative pixel and its manner of formation are illustrated in the figures and description herein; however, typically fabrication of a plurality of like pixels proceeds simultaneously. Accordingly, the following detailed description is not to be taken in a limiting sense, and the scope of the present invention is defined only by the appended claims.

The present invention relates to a method, apparatus and system for color separation and detection in a solid state imager devices. The present invention utilizes at least one sub-wavelength grating to separate the spectral components of incident light. A solid state imager device according to the present invention does not reject or absorb any spectral components as does a color filter array, but rather redirects the light to be collected onto separate photo sensors for different wavelengths. Since the sub-wavelength gratings are incorporated inside the pixels using dielectric materials, color demosaicing, color resist related contamination and aging issues associated with color filter arrays are reduced.

The long-wavelength light component, whose wavelength is greater than the grating period, is primarily diffracted into the $0^{th}$ diffraction order, and is collected by the photosensor directly underneath the grating. The short-wavelength light component, whose wavelength is smaller than the grating period, is efficiently diffracted into higher diffraction orders, and is collected by the photosensors immediately adjacent to the center one. Thus this buried sub-wavelength-grating offers improved color-separation capability.

The invention is described below with in an exemplary embodiment with reference to its use in a solid state CMOS imager; however, it should be understood that the invention may be employed in any solid state imager device and may even be employed in non-solid state imagers.

Figure 2:
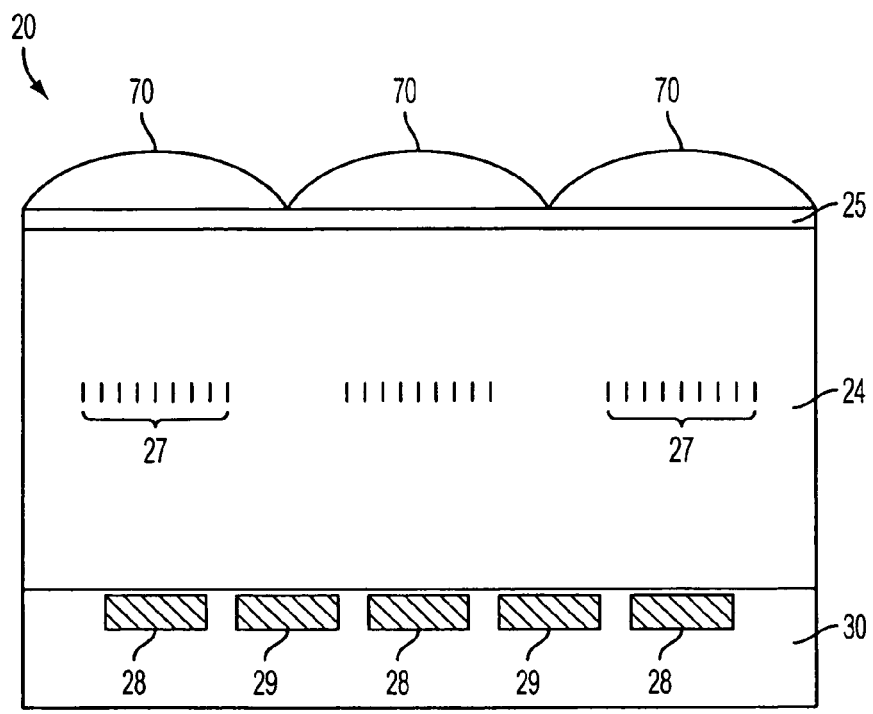
FIG. 2 illustrates a side cross-sectional view perpendicular to the grating having a diffraction grating in a shared-diode layout in accordance with an exemplary embodiment of the present invention.

Referring now to the figures, where like reference numbers designate like elements. Reference is made to FIGS. 1-2. A solid-state imager 20 is schematically illustrated in FIG. 1. The imager 20 comprises at least one grating 27 formed in light transmissive protective layer 24 over pixel sensor cells 28, 29 which have been formed on an upper surface of substrate 30, which may be any of the types of substrate described above. The pixel cell array comprises a plurality of pixel sensor cells 28, 29 formed in and over the substrate, and is covered by a protective layer 24 that acts as a passivation and planarization layer for the imager 20. Protective layer 24 may be one or more layers of BPSG, PSG, BSG, silicon dioxide, silicon nitride, polyimide, or other well-known light transmissive insulator. Preferably, the protective layer 24 is an oxide. The protective layer 24 has at least one grating 27 formed therein. The grating 27 is formed over pixel sensor cells 28, 29. A spacing layer 25 is formed over the protective layer 24 and under micro-lens 70.

While both the gratings 27 and protective layer 24 are formed of transparent materials, gratings 27 are formed of a material having a refractive index different from that of protective layer 24. Preferably gratings 27 are formed as equally spaced stripes of a silicon nitride with an index of refraction of 2.0 while the protective layer 24 is preferably formed from uniform silicon dioxide having an index refraction of 1.46. The protective layer 24 has at least one grating 27 formed therein.

FIG. 1 illustrates a solid-state imager 20 having long wavelength pixel sensor cells 28 and short wavelength pixel sensor cells 29. The long wavelength pixel sensor cells 28 may be, for example, red light pixel sensor cells. The short wavelength pixel sensor cells 29 may be, for example, blue or green light pixel sensor cells. FIG. 2 illustrates a solid-state imager 21 having different collection of long wavelength pixel sensor cells 28 and short wavelength pixel sensor cells 29.

Although the invention is illustrated with a grating having an overall rectangular shape formed by grating stripes alternating with protective layer 24, is should be appreciated that the grating 27 may be formed in other shapes, such as, for example, triangles and may also be formed of other materials for the grating stripes and protective layer which have different indices of refraction. In addition, the periodic spacing of the stripe material for grating 27 need not be uniform.

The micro-lens 70 has a pitch of from about 2 µm to about 10 µm, preferably about 4 µm, while each photosensor has a pitch of from about 0.5 µm to about 5 µm, preferably about 2 µm. For long/short wavelength color (e.g., blue/red color separation), the long (e.g., red) spectral component of the light incident on any single micro lens is directed to the photosensor centered directly under the micro lens, and the short (e.g., blue) spectral component is diffracted onto two photosensors adjacent to the red photosensor. Thus this pixel design enables long/short wavelength (e.g., red/blue) color detection without requiring a CFA and color de-mosaicing.

Likewise, for green/red color separation, the red spectral component of the light incident on any single micro lens is collected by the photosensor centered directly under this micro lens, and the green spectral component is diffracted onto the two green photosensors adjacent to the red photosensors. Thus this pixel design enables red-green color detection without requiring a CFA and color de-mosaicing.

The grating 27 diffracts white incident light into different angles and into different diffraction orders. For a transmissive grating, the $0^{th}$ diffraction order contains the directly transmitted light with unchanged propagation direction. In the $m^{th}$ diffraction order, the incident light changes direction according to the well-known grating equation:

$$d \times (\sin \alpha + \sin \beta) = m \times \lambda \quad (1)$$

where d is the grating period, β is the incident angle, α is the diffraction angle, m is the diffraction order, and λ is the wavelength.

Figure 3:
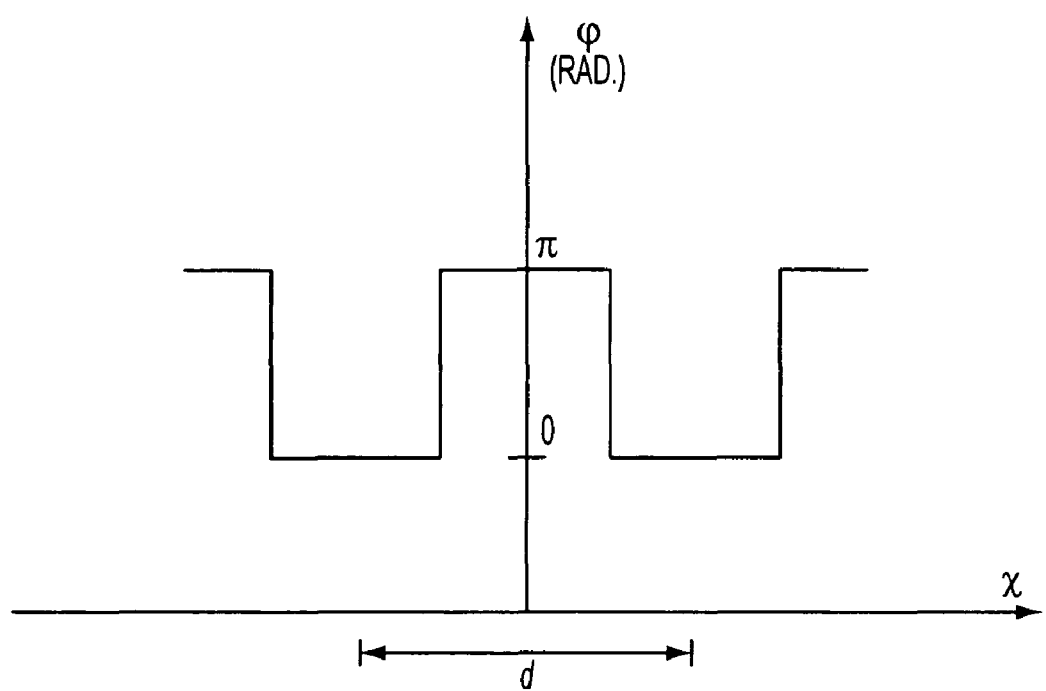
FIG. 3 is a graph illustrating the optical phase as a function of spatial dimension for a square-wave grating.

One characteristic of the grating is the diffraction efficiency. An exemplary grating 27 is a phase grating, more preferably a square-wave grating, which has an OPD (optical path difference) varying periodically (period d) such that the phase of the transmitted light alternates between 0 radians and π radians. For example, when blue light (λ<d) passes through a thin square-wave grating, the optical phase as a function of spatial dimension can be plotted as illustrated in FIG. 3. Using Fourier analysis, the diffraction efficiencies of the transmitted light into different diffraction orders (m≠0) are calculated as:

$$\eta_m = [2/(\pi m)]^2 \times \sin^2(\pi m/2) \quad (2)$$

From equation (2), the diffraction efficiencies of the $\pm 1^{st}$ (m=±1) orders are both calculated to be 41%, resulting in a total diffraction efficiency of 82%. As a comparison, the diffraction efficiency of the $0^{th}$ order is 0% (i.e., no light passes directly through).

When the optical wavelength becomes greater than the grating period, e.g. λ>d for the red light, the phase grating 27 becomes a sub-wavelength grating for the red light, and no valid diffraction angle can be calculated from equation (1). In this situation, light going into the non-$zero^{th}$ diffraction orders becomes evanescent and non-propagating, carrying no photo energy. Thus all the light energy goes into the $0^{th}$ order, i.e. passes through the grating 27 without changing propagation direction. From a more intuitive point of view, since the grating period is smaller than the wavelength, the red light passes through the grating without "seeing" or interacting with the spatial-variation property of the grating profile. To long wavelength light (red+IR spectral components), the square-wave appears as a slab of uniform material with the index of refraction being the average of the grating material and the surrounding medium.

Incorporating diffraction gratings into an imager pixel design, and choosing the grating period to be longer than some part of the light spectrum, e.g. blue wavelength, but shorter than some other part of the light spectrum, e.g. red wavelength, the grating will act as a diffraction grating to diffract the blue light into the photosensors for blue light, and act as only a thin slab of uniform material to transmit the red light onto the photosensor for red light immediately underneath the grating 27. Likewise, choosing the grating period to be longer than green wavelength but shorter than red wavelength, the grating will act as a diffraction grating to diffract the green light onto the photosensors for green light, and act as only a thin slab of uniform material to transmit the red light onto the photosensors for red light immediately underneath the grating 27.

Figure 4:
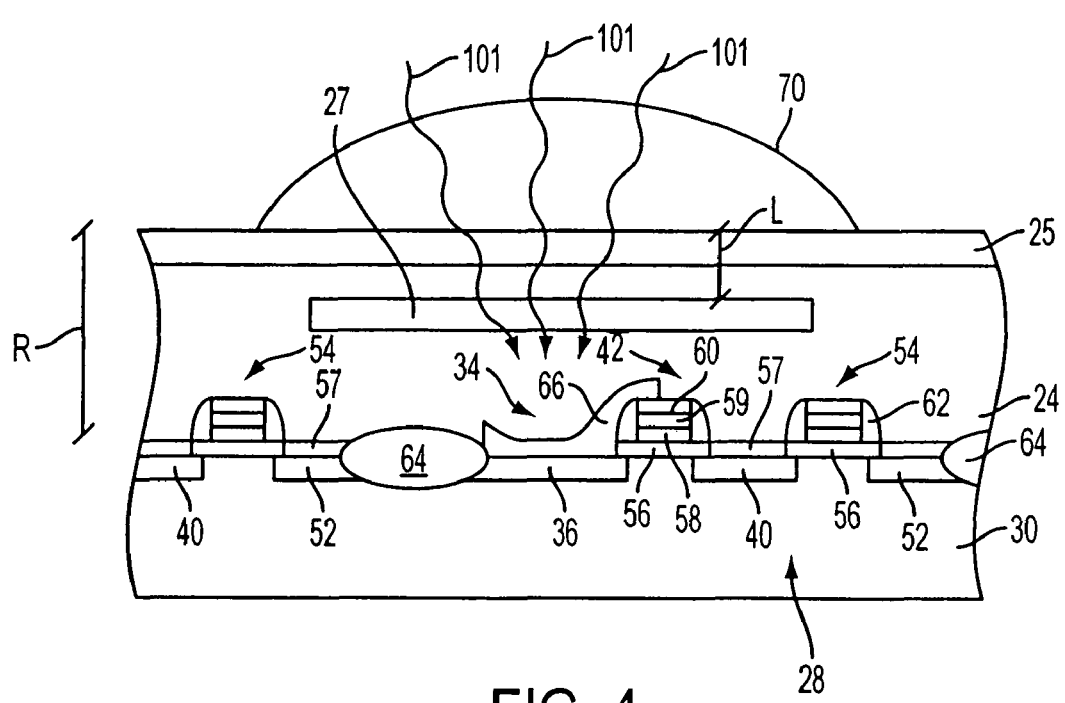
FIG. 4 illustrates a schematic cross-sectional view of a CMOS imager pixel cell parallel to the grating having a wavelength grating constructed in accordance with an exemplary embodiment of the present invention.
Figure 5:
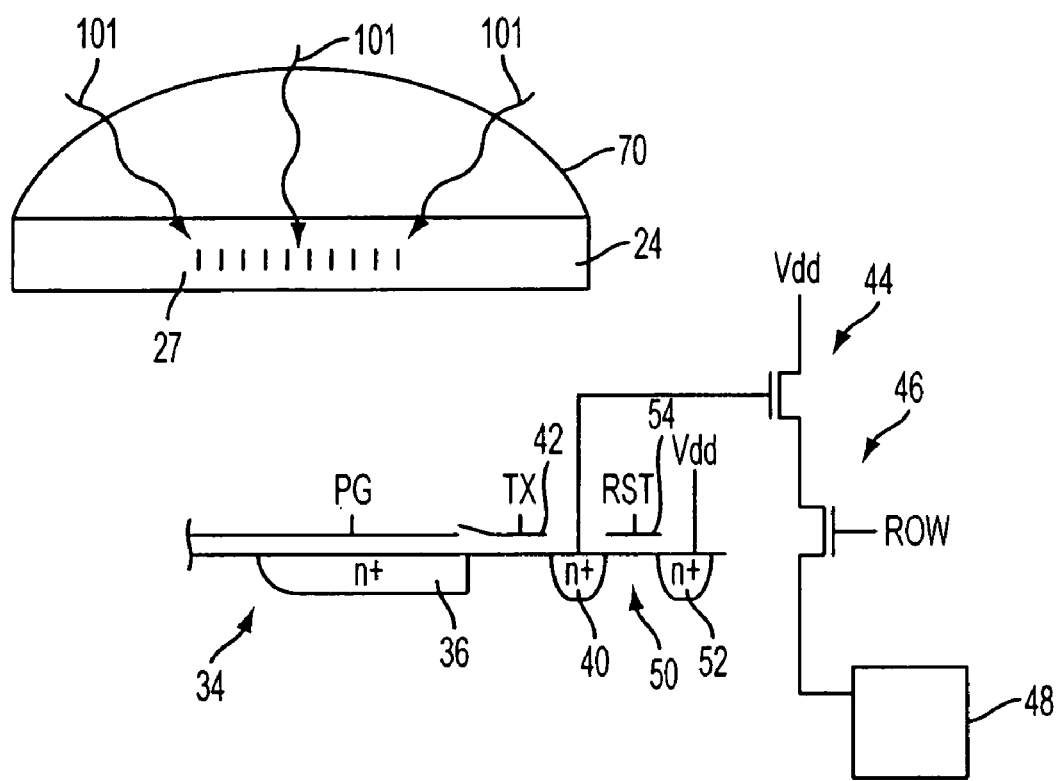
FIG. 5 is a representative diagram of the CMOS imager pixel cell of FIG. 4.

Reference is now made to FIGS. 4-5. FIG. 4 shows an expanded view of the solid-state imager discussed above. The pixel array 26 shown in FIGS. 1 and 3 comprises a plurality of pixel sensor cells 28 formed in and over the substrate 30, and is covered by a protective layer 24 that acts as a passivation, planarization and metallization layer for the imager 20. Protective layer 24 may include one or more passivation and metallization layers. The passivation portion of the protective layer 24 may be a layer of BPSG, PSG, BSG, silicon dioxide, silicon nitride, polyimide, or other well-known light transmissive insulator. A grating 27 is formed in protective layer 24. The grating 27 comprises a material having a different refractive index than protective layer 24, as discussed above.

The stack height (the distance R between the micro-lens and the photosensor) is from about 2 μm to about 10 μm, preferably about 4 μm. The grating 27 is buried under the micro-lens 70 at a distance L which is from about 0.5 μm to about 5 μm, preferably about 2 μm. The grating 27 preferably has a stripe period of from about 150 nm to about 700 nm, preferably about 400 nm for the blue-red light separation illustrated in FIGS. 1-2. The grating 27 preferably has a duty cycle of 30% and has a height of from about 150 nm to about 700 nm, preferably about 400 nm. The total width of the grating is from about 1.5 μm to about 6.0 μm, preferably about 3.6 μm. At least two complete grating periods are present under the micro-lens, preferably about 5-10 complete gratings, more preferably from about 8-9 complete grating periods are present under the micro-lens. There is no need for the grating to be infinitely long since only its center portion is effectively illuminated due to the use of a micro lens above the grating.

As shown in FIGS. 1, 2, 4, and 5, each pixel sensor cell contains a photosensor 34, which may be a photodiode, photogate, or the like. A photogate photosensor 34 is depicted in FIGS. 1, 2, 4, and 5. An applied control signal PG is applied to the photogate 34 so that when incident radiation 101 in the form of photons passes gratings 27 and strikes the photosensor 34, the photo-generated electrons accumulate in the doped region 36 under the photosensor 34. A transfer transistor 42 is located next to the photosensor 34, and has source and drain regions 36, 40 and a gate stack 42 controlled by a transfer signal TX. The drain region 40 is also called a floating diffusion region, and it passes charge received from the photosensor 34 to output transistors 44, 46 and then to readout circuitry 48. A reset transistor 50 comprised of doped regions 40, 52 and gate stack 54 is controlled by a reset signal RST which operates to reset the floating diffusion region 40 to a predetermined initial voltage just prior to signal readout. Details of the formation and function of the above-described elements of a pixel sensor cell may be found, for example, in U.S. Pat. Nos. 6,376,868 and 6,333,205, the disclosures of which are incorporated by reference herein.

As illustrated in FIG. 4, the gate stacks 42, 54 for the transfer 42 and reset 54 transistors include a silicon dioxide or silicon nitride insulator 56 on the substrate 30, which in this example is a p-type substrate, a conductive layer 58 of doped polysilicon, tungsten, or other suitable material over the insulating layer 56, and an insulating cap layer 60 of, for example, silicon dioxide, silicon nitride, or ONO (oxide-nitride-oxide). A silicide layer 59 may be used between the polysilicon layer 58 and the cap 60, if desired. Insulating sidewalls 62 are also formed on the sides of the gate stacks 42, 54. These sidewalls 62 may be formed of, for example, silicon dioxide, silicon nitride, or ONO. A field oxide layer 64 around the pixel sensor cell 28 serves to isolate it from other pixel cells in the array. A second gate oxide layer 57 may be grown on the silicon substrate and the photogate semi-transparent conductor 66 is patterned from this layer. In the case that the photosensor is a photodiode, no second gate oxide layer 57 and no photogate semi-transparent conductor 66 is required. Furthermore, transfer transistor 42 is optional, in which case the diffusion regions 36 and 40 are connected together.

The image devices 20 and 21 described above with reference to FIGS. 1-2 and 4-5 are manufactured through a process described as follows, and illustrated in FIGS. 6-8.

Figure 6:
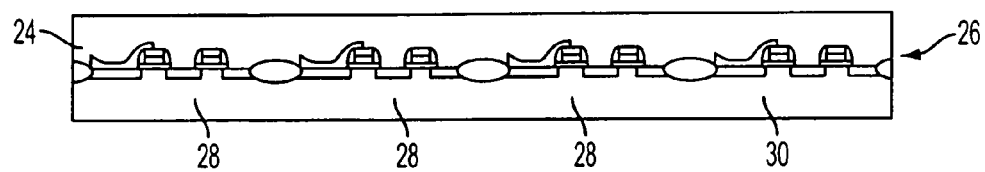
FIG. 6 illustrates a cross-sectional view of a semiconductor wafer undergoing the process of forming an imaging device having a diffraction grating according to an exemplary embodiment of the present invention.

Referring now to FIG. 6, a substrate 30, which may be any of the types of substrates described above, having a pixel cell array 26, peripheral circuits, contacts and wiring formed thereon by well-known methods, is provided. A protective layer 24 of BPSG, BSG, PSG, silicon dioxide, silicon nitride or the like is formed over the pixel cell array 26 to passivate it and to provide a planarized surface.

Figure 7:
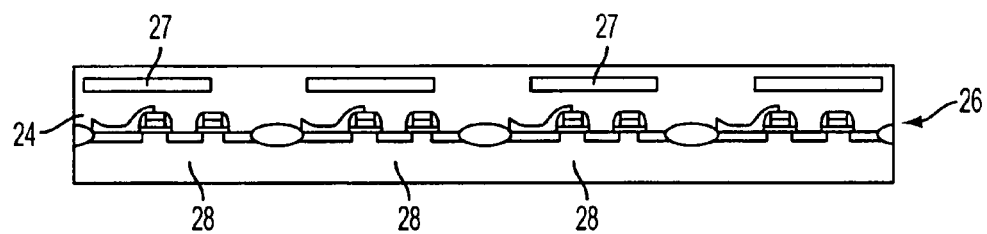
FIG. 7 illustrates the semiconductor wafer of FIG. 6 at a stage of processing subsequent to that shown in FIG. 6.

Reference is now made to FIG. 7. The protective layer 24 is patterned and etched to form striped areas for gratings 27 by standard lithographic methods. The gratings 27 may be deposited into the etched areas in the protective layer 24 by standard deposition techniques. After the gratings have been deposited, the grating material is chemical/mechanical polished to the level of the top of the trenches. Alternatively, the grating material may be deposited in stripes onto a flat surface. A protective material is then deposited into the spaces between the grating material and chemical/mechanical polished to form gratings 27. In another alternative, the grating material can be formed by epitaxial growth by masking, growing the grating material and the performing chemical/mechanical polishing to form gratings 27.

As discussed above with reference to FIG. 1-2 and 4-5, gratings 27 are formed of a material having a refractive index different from that of protective layer 24. As a preferred example, gratings 27 are formed of a silicon nitride with an index of refraction of 2.0 while the protective layer 24 is preferably formed from uniform silicon dioxide having an index refraction of 1.45.

Figure 8:
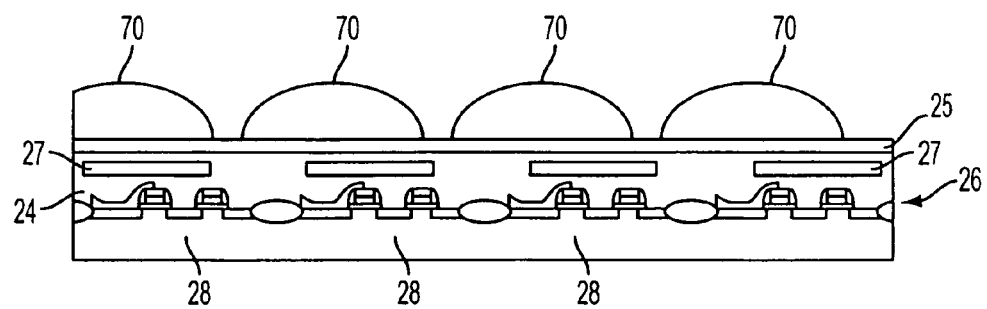
FIG. 8 illustrates the semiconductor wafer of FIG. 6 at a stage of processing subsequent to that shown in FIG. 7.

A spacing layer 25 is formed over the protective layer 24, as illustrated in FIG. 8. Lenses 70 may then be formed from a lens forming layer, for example, so that each lens 70 overlies a pixel cell 28. Alternative constructions in which a lens 70 overlies multiple pixel cells 28 are also encompassed by the present invention. It should also be understood that the preceding examples discuss one embodiment of the present invention.

Figure 9A:
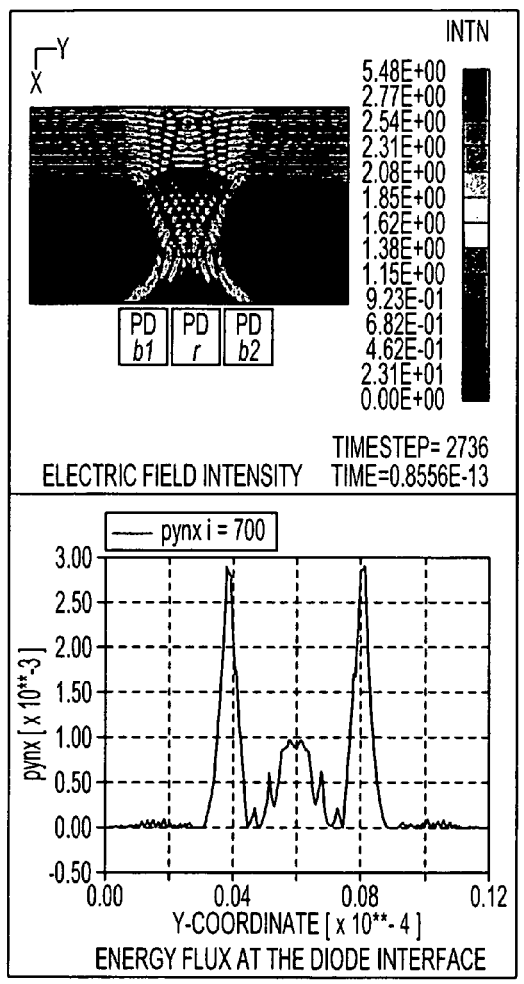
FIG. 9A and 9B are graphs illustrating the photo energy flux of different wavelengths.
Figure 9B:
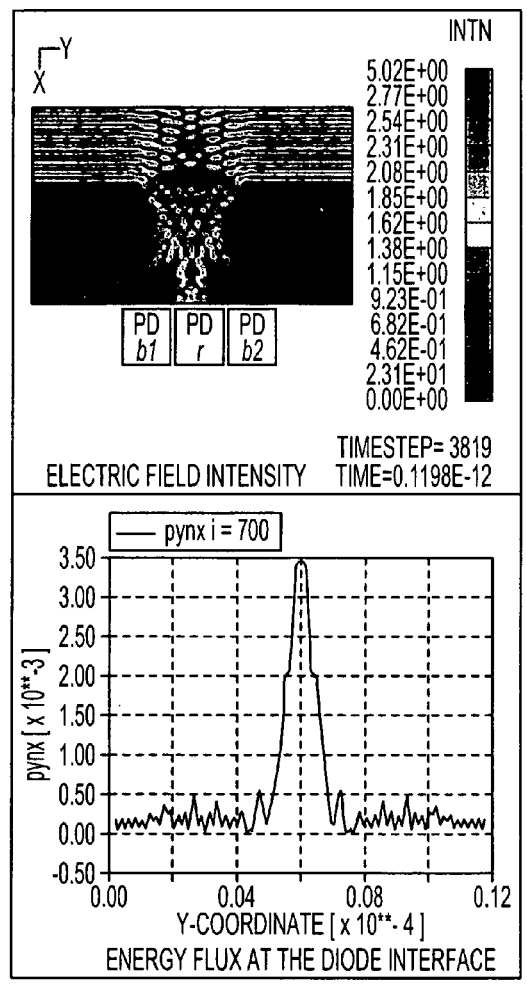

Reference is now made to FIG. 9. The pixel performance of an imaging pixel having a plurality of buried gratings was analyzed using an electromagnetic simulation tool (e.g., EMFLEX). EMFLEX solves the Maxwell's equations numerically using the finite-element method, thus presenting a true picture of the optical properties of the imaging pixel. FIGS. 9A and 9B show the photo energy distributions at $\lambda=450$ nm (the center of the blue spectrum) and at $\lambda=630$ nm (the edge of the red spectrum), respectively. As illustrated in FIGS. 9A and 9B, the grating 27 effectively diffracts the blue energy into the neighboring blue photosensors and transmits the red energy into the immediate underneath red photosensor.

Figure 10:
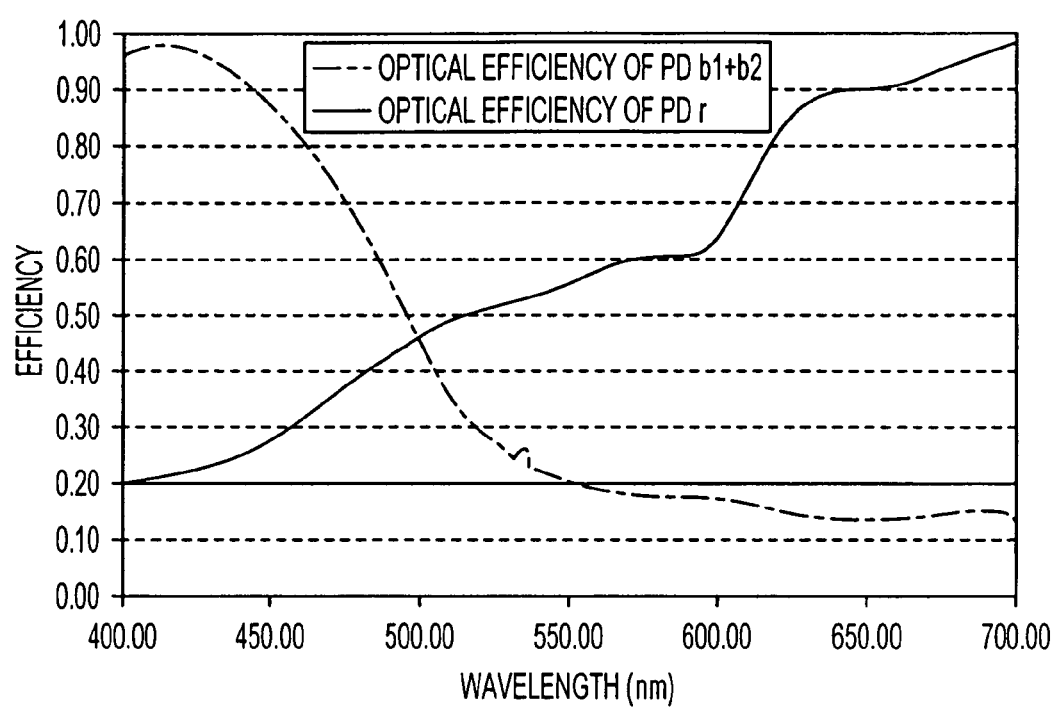
FIG. 10 is a graph illustrating the spectral analysis of the pixel design with buried sub-wavelength gratings.

Reference is now made to FIG. 10. This figure shows the efficiencies of two photosensors 'b1+b2' (equivalent as the photo efficiency of the diode 'b1' to collect the photon energies from its two adjacent 4 μm micro-lenses) and a third photosensor 'r' to collect the light incident on the micro-lens. The dashed line represents the total photo-energy-collection efficiency by the photosensors b1 and b2 as a function of wavelength. As can be seen in the FIG. 10, major portion of the red signal goes into the photosensor 'r', and most of the blue signal goes into the photosensors 'b1+b2'. In the green spectral region, part of the energy goes into the photosensor 'r' and part of the energy goes into the photosensors 'b1+b2'. The energy splitting ratio is a function of the wavelength. Because the grating period is approaching the optical wavelength, the gratings act more like volume gratings rather than thin phase gratings, and the EMFLEX simulation differs from the prediction of equation (2).

Rather than rejecting any photon, the sub-wavelength gratings direct the photons of different colors into the corresponding photosensors. Theoretically, with a high-efficiency grating, the quantum efficiency could reach 100% (no light is rejected). Compared with the theoretical quantum efficiency of ~33% (⅓ of light is accepted by a color filter and ⅔ is rejected) for the traditional CFA color-detection scheme, the efficiency of an imager can be improved by 200%.

Figure 11:
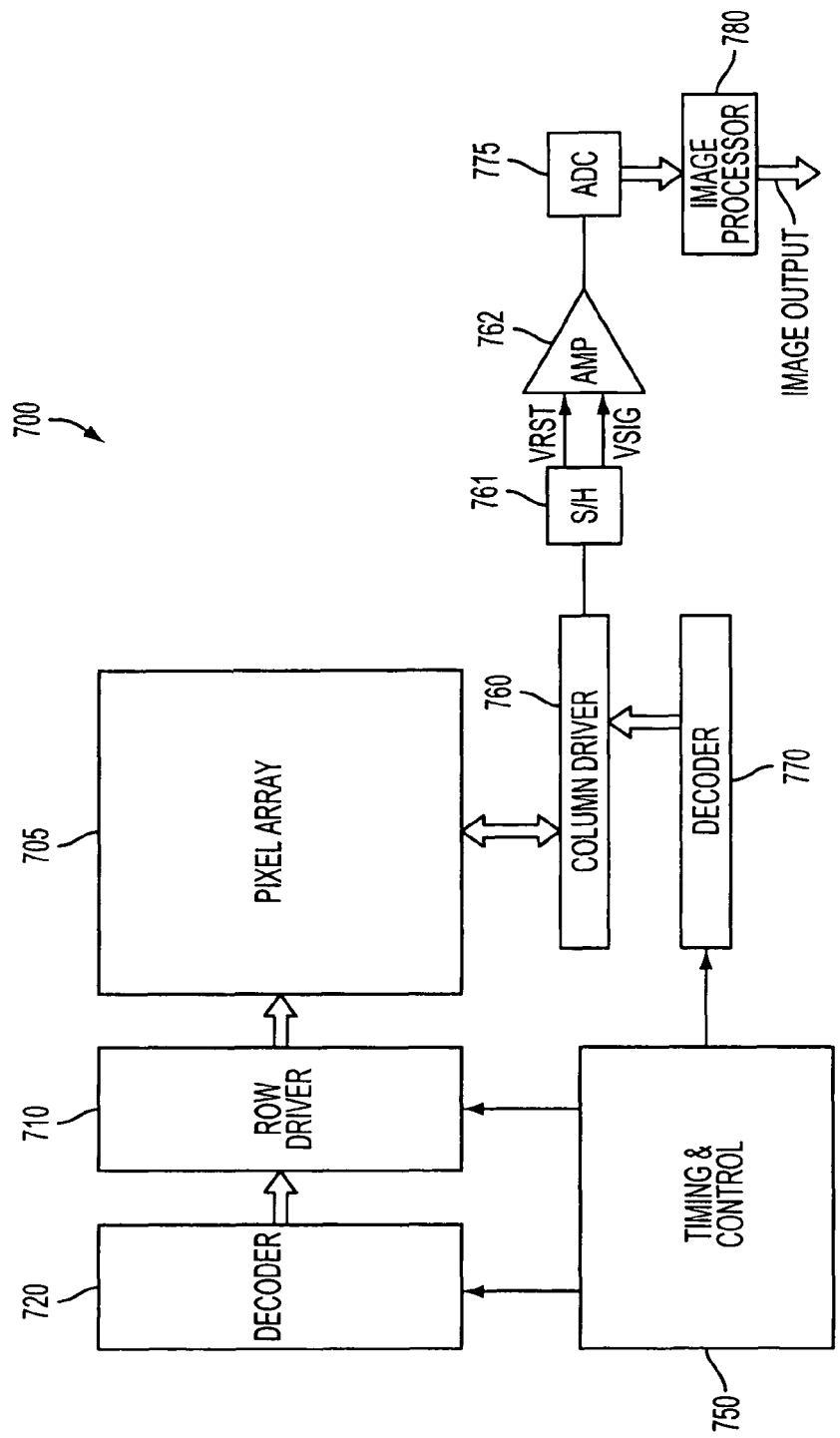
FIG. 11 shows an imager constructed in accordance with an embodiment of the invention.

FIG. 11 illustrates an exemplary imager 700 that may utilize any embodiment of the invention. The Imager 700 has a pixel array 705 comprising pixels constructed as described above with respect to FIGS. 1-10, or using other pixel architectures. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760.

A sample and hold circuit 761 associated with the column driver 760 reads a pixel reset signal Vrst and a pixel image signal Vsig for selected pixels. A differential signal (Vrst-Vsig) is amplified by differential amplifier 762 for each pixel and is digitized by analog-to-digital converter 775 (ADC). The analog-to-digital converter 775 supplies the digitized pixel signals to an image processor 780 which forms a digital image.

Figure 12:
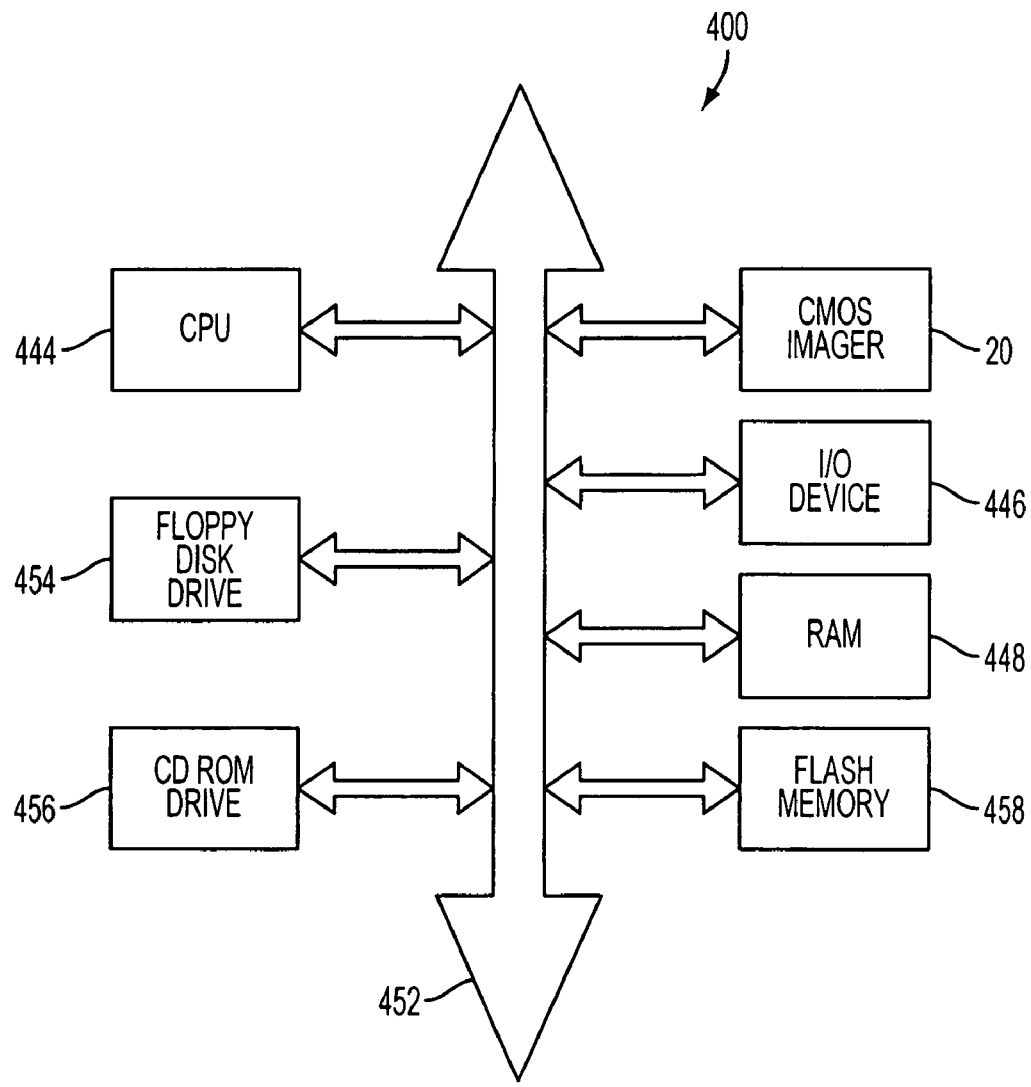
FIG. 12 is an illustration of an imaging system having an imager with reduced fixed pattern noise according to an exemplary embodiment of the present invention.

If desired, the imager 20 may be combined with a processor, such as a CPU, digital signal processor or microprocessor. The imager 20 and the microprocessor may be formed in a single integrated circuit. An exemplary processor system 400 using a CMOS imager having a filter array in accordance with the present invention is illustrated in FIG. 12. A processor based system is exemplary of a system having digital circuits which could include CMOS or other imager devices. Without being limiting, such a system could include a computer system, camera system, scanner, machine vision system, vehicle navigation system, video telephone, surveillance system, auto focus system, star tracker system, motion detection system, image stabilization system and other image processing systems.

Another application of the present invention may be a hybrid infrared-visible imager design. The sub-wavelength gratings have very high ($0^{th}$-order) transmissivity for the long-wavelength infrared light, and have high diffraction efficiency for the short-wavelength visible light. If infrared-light photo detectors are placed right underneath the gratings to collect the $0^{th}$-order transmitted photons, and visible-light photo detectors are placed to collect the higher-order diffracted photons (e.g. $1^{st}$-order diffraction), a hybrid infrared-visible imager for the enhanced night/daytime vision can be engineered.

As shown in FIG. 12, an exemplary processor system 400, for example, a camera generally comprises a central processing unit (CPU) 444, e.g., a microprocessor, that communicates with an input/output (I/O) device 446 over a bus 452. The imager 20 also communicates with the system over bus 452. The computer system 400 also includes random access memory (RAM) 448, and may include peripheral devices such as a floppy disk drive 454, a compact disk (CD) ROM drive 456 or a flash memory 458 which also communicate with CPU 444 over the bus 452. The floppy disk 454, the CD ROM 456 or flash memory 458 stores images captured by imager 20. The imager 20 is preferably constructed as an integrated circuit, with or without memory storage, as previously described with respect to FIGS. 1 and 3-8.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

The invention claimed is:

1. An imager comprising:
an array of pixel sensor cells formed at an upper surface of a substrate; and
a light transmissive layer having at least one diffraction grating formed therein, the diffraction grating being formed over at least one of the pixel sensor cells,
wherein the diffraction grating comprises a plurality of periodically spaced grating stripes formed of a material having a different refractive index than a refractive index of a material of the light transmissive layer, and
wherein the diffraction grating has a grating period that is between a long-wavelength component and short-wavelength component of incident light causing the diffraction grating to:
diffract the long-wavelength light component, having a wavelength greater than the grating period of the diffraction grating, into the $0^{th}$ diffraction order such that the diffracted long-wavelength light component is collected by a photosensor corresponding to one of the array of pixel sensor cells that is directly underneath the diffraction grating, and
diffract the short-wavelength light component, having a wavelength less than the grating period of the diffraction grating, into higher diffraction orders such that the diffracted short-wavelength light component is collected by photosensors corresponding to those of the array of pixel sensor cells that are immediately adjacent the photosensor that is directly underneath the diffraction grating.

2. The imager according to claim 1, wherein the grating stripes are formed of silicone nitride and the light transmissive layer is formed of silicon dioxide.

3. The imager according to claim 1, further comprising a micro-lens formed over the at least one diffraction grating.

4. The imager according to claim 3, wherein the at least one diffraction grating is buried under the micro-lens at a distance from the micro-lens of from about 0.5 µm to about 5 µm.

5. The imager according to claim 3, wherein the at least one diffraction grating is buried under the micro-lens at a distance from the micro-lens of about 2 µm.

6. The imager according to claim 1, wherein the at least one diffraction grating has a period within the range of about 150 nm to about 700 nm.

7. The imager according to claim 1, wherein the at least one diffraction grating has a period of about 400 nm.

8. The imager according to claim 1, further comprising a micro-lens formed over the light transmissive layer.

9. The imager according to claim 8, wherein the at least one diffraction grating is buried under the micro-lens at a distance from the micro-lens of from about 0.5 µm to about 5 µm.

10. The imager according to claim 8, wherein the at least one diffraction grating is buried under the micro-lens at a distance from the micro-lens of about 2 µm.

11. The imager according to claim 1, wherein the at least one diffraction grating has a height of from about 150 nm to about 700 nm.

12. The imager according to claim 1, wherein the at least one diffraction grating has a height of about 400 nm.

13. The imager according to claim 1, wherein the at least one diffraction grating includes a plurality of diffraction gratings.

14. The imager according to claim 13, wherein each of the plurality of diffraction gratings has a total width of about 1.5 µm to about 6.0 µm.

15. The imager according to claim 13, wherein each of the plurality of diffraction gratings has a total width of about 3.6 µm.

16. The imager according to claim 1, wherein the imager includes a plurality of diffraction gratings to diffract a plurality of wavelengths of light into a plurality of pixel sensor cells, each of the pixel sensor cells sensing a predetermined wavelength of light.

17. The imager according to claim 1, wherein the long-wavelength light component is red light and the short-wavelength light component is blue light.

18. The imager according to claim 1, wherein the long-wavelength light component is red light and the short-wavelength light component is green light.

19. An image processing system comprising:
an array, comprising a plurality of pixel sensor cells, formed at an upper surface of a substrate;
a light transmissive layer having at least one diffraction grating formed therein, the diffraction grating being formed over at least one of the pixel sensor cells,
wherein the diffraction grating comprises a plurality of periodically spaced grating stripes formed of a material having a different refractive index than a refractive index of a material of the light transmissive layer, and
wherein the diffraction grating has a grating period that is between a long-wavelength component and short-wavelength component of incident light causing the diffraction grating to:
diffract the long-wavelength light component, having a wavelength greater than the grating period of the diffraction grating, into the $0^{th}$ diffraction order such that the diffracted long-wavelength light component is collected by a photosensor corresponding to one of the array of pixel sensor cells that is directly underneath the diffraction grating, and
diffract the short-wavelength light component, having a wavelength less than the grating period of the diffraction grating, into higher diffraction orders such that the diffracted short-wavelength light component is collected by photosensors corresponding to those of the array of pixel sensor cells that are immediately adjacent the photosensor that is directly underneath the diffraction grating; and
a processor for receiving and processing data representing an image sensed by the plurality of pixel sensor cells.

20. The image processing system according to claim 19, wherein the at least one grating is formed of a material having a first refractive index and the light transmissive layer is formed of a material having a second refractive index.

21. The image processing system according to claim 20, wherein the at least one grating is formed from silicone nitride and the light transmissive layer is formed from silicon dioxide.

22. The image processing system according to claim 19, further comprising a micro-lens formed over the at least one grating.

23. The image processing system according to claim 22, wherein the at least one grating is buried under the micro-lens at a distance of from about 0.5 µm to about 5 µm.

24. The image processing system according to claim 22, wherein the at least one grating is buried under the micro-lens at a distance of about 2 µm.

25. The image processing system according to claim 19, wherein the at least one grating has a period of from about 150 nm to about 700 nm.

26. The image processing system according to claim 19, wherein the at least one grating has a period of about 400 nm.

27. The image processing system according to claim 19, wherein the at least one grating has a height of from about 150 nm to about 700 nm.

28. The image processing system according to claim 19, wherein the at least one grating has a height of about 400 nm.

29. The image processing system according to claim 19, wherein the at least one grating includes a plurality of gratings.

30. The image processing system according to claim 19, wherein the at least one diffraction grating has a total width of about 1.5 µm to about 6.0 µm.

31. The image processing system according to claim 19, wherein the at least one diffraction grating has a total width of about 3.6 µm.

32. The image processing system according to claim 19, wherein the array and the processor are formed on a single substrate.

33. The image processing system according to claim 19, wherein the light transmissive layer includes the at least one diffraction grating to diffract a plurality of wavelengths of light into the plurality of pixel sensor cells, each of the pixel sensor cells sensing a predetermined wavelength of light.

34. The image processing system according to claim 19, wherein the image processing system separates red light from blue light.

35. The image processing system according to claim 19, wherein the image processing system separates red light from green light.

36. An imager comprising:
an array of pixel sensor cells; and
a light transmissive material having at least one diffraction grating formed therein, the diffraction grating being formed over at least one of the pixel sensor cells and comprising a plurality of periodically spaced grating stripes formed of a material different than the light transmissive material,
wherein the diffraction grating has a grating period that is between a wavelength of a first color component of light and a wavelength of a second color component of light, causing the diffraction grating to:
diffract the first color component of light, having a wavelength greater than the grating period of the diffraction grating, such that it is collected by a photosensor corresponding to one of the array of pixel sensor cells that is directly underneath the diffraction grating, and
diffract the second color component of light, having a wavelength less than the grating period of the diffraction grating, such that it is collected by photosensors corresponding to those of the array of pixel sensor cells that are adjacent to the photosensor directly underneath the diffraction grating.

37. The imager according to claim 36, wherein the first color component is red light and the second color component is blue light.

38. The imager according to claim 36, wherein the first color component is red light and the second color component is green light.

39. The imager according to claim 36, wherein the at least one grating is formed of a material having a first refractive index and the light transmissive material has a second refractive index.

40. The imager according to claim 36, wherein the grating stripes are formed of silicone nitride and the light transmissive material is silicon dioxide.

41. The imager according to claim 36, further comprising a micro-lens formed over the at least one diffraction grating.

42. The imager according to claim 41, wherein the at least one diffraction grating is buried under the micro-lens at a distance from the micro-lens of from about 0.5 µm to about 5 µm.

43. The imager according to claim 36, wherein the at least one diffraction grating has a period within the range of about 150 nm to about 700 nm.

44. The imager according to claim 36, wherein the at least one grating has a height of from about 150 nm to about 700 nm.

45. The imager according to claim 36, wherein the at least one diffraction grating includes a plurality of diffraction gratings.

46. The imager according to claim 45, wherein each of the plurality of diffraction gratings has a total width of about 1.5 µm to about 6.0 µm.

* * * * *